United States Patent
Sadaka et al.

(10) Patent No.: US 7,402,477 B2
(45) Date of Patent: Jul. 22, 2008

(54) METHOD OF MAKING A MULTIPLE CRYSTAL ORIENTATION SEMICONDUCTOR DEVICE

(75) Inventors: Mariam G. Sadaka, Austin, TX (US); Bich-Yen Nguyen, Austin, TX (US); Ted R. White, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 197 days.

(21) Appl. No.: 11/393,563

(22) Filed: Mar. 30, 2006

(65) Prior Publication Data

US 2007/0238233 A1    Oct. 11, 2007

(51) Int. Cl.
*H01L 21/8238* (2006.01)
(52) U.S. Cl. ............. 438/199; 438/226; 257/E21.632
(58) Field of Classification Search ............ 438/197, 438/225, 226, 269, 413, 416, 429, 442, 814, 438/584, 597, 607, 142, 199, 200, 245, 514; 257/E21.632
See application file for complete search history.

(56) References Cited

U.S. PATENT DOCUMENTS

| | | | |
|---|---|---|---|
| 6,635,543 B2 | 10/2003 | Furukawa et al. | |
| 6,764,917 B1 | 7/2004 | Chan et al. | |
| 6,921,961 B2 | 7/2005 | Sanchez et al. | |
| 2005/0070077 A1 | 3/2005 | Guarini et al. | |
| 2005/0158931 A1 | 7/2005 | Chen et al. | |
| 2005/0275018 A1 | 12/2005 | Venkatesan et al. | |
| 2006/0094169 A1* | 5/2006 | White et al. | 438/149 |
| 2006/0292834 A1* | 12/2006 | Lin et al. | 438/478 |

FOREIGN PATENT DOCUMENTS

WO    WO 2004/114400 A1    12/2004

OTHER PUBLICATIONS

Doris, B. et al; "A Simplified Hybrid Orientation Technology (SHOT) for High Performance CMOS"; VLSI; 2004.
Yang, M. et al.; "High Performance CMOS Fabricated on Hybrid Substrate With Different Crystal Orientations"; IEDM; 2003; 4 pgs; IEEE.
Yang, M. et al.; "High Performance CMOS Fabricated on Hybrid Substrate With Different Crystal Orientations"; IBM Presentation IDEM 2003; 30 pgs.
International Search Report and Written Opinion, (Oct. 27, 2007).

* cited by examiner

*Primary Examiner*—Brook Kebede
(74) *Attorney, Agent, or Firm*—Michael J. Balconi-Lamica; James L. Clingan, Jr.

(57) ABSTRACT

A method of having transistors formed in enhanced performance crystal orientations begins with a wafer having a semiconductor substrate (12,52) of a first surface orientation, a thin etch stop layer (14,54) on the semiconductor substrate, a buried oxide layer (16,56) on the thin etch stop layer, and a semiconductor layer (18,58) of a second surface orientation on the buried oxide layer. An etch penetrates to the thin etch stop layer. Another etch, which is chosen to minimize the damage to the underlying semiconductor substrate, exposes a portion of the semiconductor substrate. An epitaxial semiconductor (28,66) is then grown from the exposed portion of the semiconductor substrate to form a semiconductor region having the first surface orientation and having few, if any, defects. The epitaxially grown semiconductor region is then used for enhancing one type of transistor while the semiconductor layer of the second surface orientation is used for enhancing a different type of transistor.

16 Claims, 9 Drawing Sheets

METHOD OF MAKING A MULTIPLE CRYSTAL ORIENTATION SEMICONDUCTOR DEVICE

BACKGROUND

The present disclosures relate to semiconductor devices, and more particularly, to a method of making a multiple crystal orientation semiconductor device.

Substrates with Dual Orientation (DSO) are desirable because they allow taking advantage of enhanced electron and hole mobility in the (100) and (110) crystal orientations, respectively. In one method of making a dual orientation substrate, the method requires etching through the buried oxide (BOX) to access the bottom substrate. The bottom substrate provides the alternate Si plane to the SOI layer. However, dry etching through the BOX and stopping on bottom Si substrate can induce damage on the Si surface of the bottom substrate. This damage can negatively impact the selective Si epitaxy process, thus resulting in dislocations in the active area of the selective Si epi. Thus, the damage is detrimental to subsequently formed devices since the damage induces defects into the channel epi.

Accordingly, there is a need for an improved method for overcoming the problems in the art as discussed above.

BRIEF DESCRIPTION OF THE DRAWINGS

The present invention is illustrated by way of example and not limited by the accompanying figures, in which like references indicate similar elements, and in which.

The use of the same reference symbols in different drawings indicates similar or identical items. Skilled artisans will also appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

Figure 1:
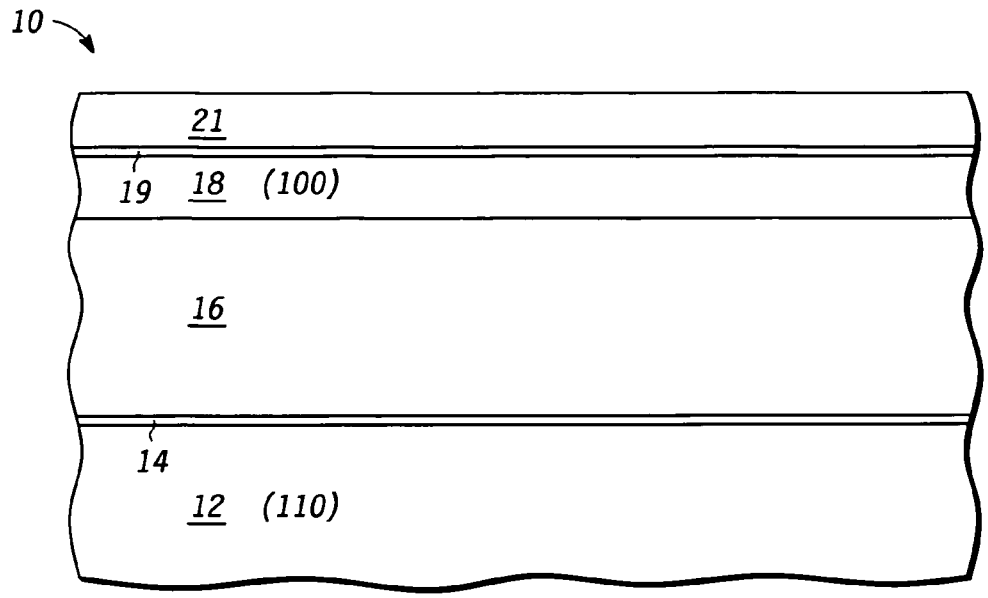
FIGS. 1-8 illustrate device cross-sections at various process steps in the method of making a semiconductor device structure having multiple crystal orientations according to an embodiment of the present disclosure.

FIGS. 1-8 illustrate device cross-sections at various process steps in the method of making a semiconductor device structure having multiple crystal orientations according to one embodiment of the present disclosure. Turning now to FIG. 1, a portion of a semiconductor device 10 includes a semiconductor-on-insulator (SOI) substrate 12 having an etch stop layer 14 disposed between a buried oxide (BOX) layer 16 and substrate 12 of the SOI structure. In one embodiment, the etch stop layer 14 comprises an etch stop layer added to the SOI structure as part of a layer transfer or wafer bonding process during the manufacture of the SOI wafer. SOI structure comprises any suitable semiconductor-on-insulator structure according to the particular requirements of a given semiconductor device application. For example, the SOI structure could include a silicon-on-insulator structure, a germanium-on-insulator structure, or other suitable strained or non-strained semiconductor on insulator structure.

Etch stop layer 14 comprises a layer selected in conjunction with an available highly selective etch chemistry or chemistries, with respect to the BOX layer 16 and with respect to the underlying SOI substrate 12. In particular, layer 14 acts as an etch stop for a subsequent oxide etch with respect to BOX layer 16. The etch stop layer 14 comprises, for example, a nitride, hafnium oxide, or any other suitable dielectric or insulator. Furthermore, in another embodiment, the etch stop layer 14 can comprise any suitable dielectric layer stack. One example of a dielectric layer stack includes an oxide and a nitride, wherein the oxide is overlying the underlying SOI substrate and the nitride is on top of the oxide. Furthermore, the etch stop layer 14 can comprise a dielectric layer stack of a high-K dielectric layer with an oxide interface layer, wherein high-K represents any dielectric value greater than a predetermined threshold dielectric value.

In addition, an SOI layer 18 is disposed overlying the BOX 16. In one embodiment, the substrate 12 includes a first crystal orientation and the SOI layer 18 includes a second crystal orientation. Substrate 12 can comprise any suitable semiconductor substrate for a given semiconductor device application. In one embodiment, substrate 12 comprises silicon. In addition, SOI layer 18 comprises any suitable semiconductor layer for a given semiconductor device application. In one embodiment, SOI layer 18 comprises silicon.

As illustrated, substrate 12 comprises a semiconductor substrate having a (110) crystal orientation and SOI layer 18 comprises a semiconductor layer having a (100) crystal orientation. Other combinations of crystal orientations are possible, for example, substrate 12 can comprise a semiconductor substrate having a (100) crystal orientation and SOI layer 18 can comprise a semiconductor layer having a (110) crystal orientation.

Further with reference to FIG. 1, a suitable pad oxide 19 and a first anti-reflective coating (ARC)/polish stop layer 21 are disposed overlying the SOI layer 18, as discussed further herein. Pad oxide 19 provides a buffer between the ARC/polish stop layer 21 and the SOI layer 18. In one embodiment, pad oxide 19 comprises a thermal oxide and the ARC/polish stop layer 21 comprises a nitride.

Figure 2:
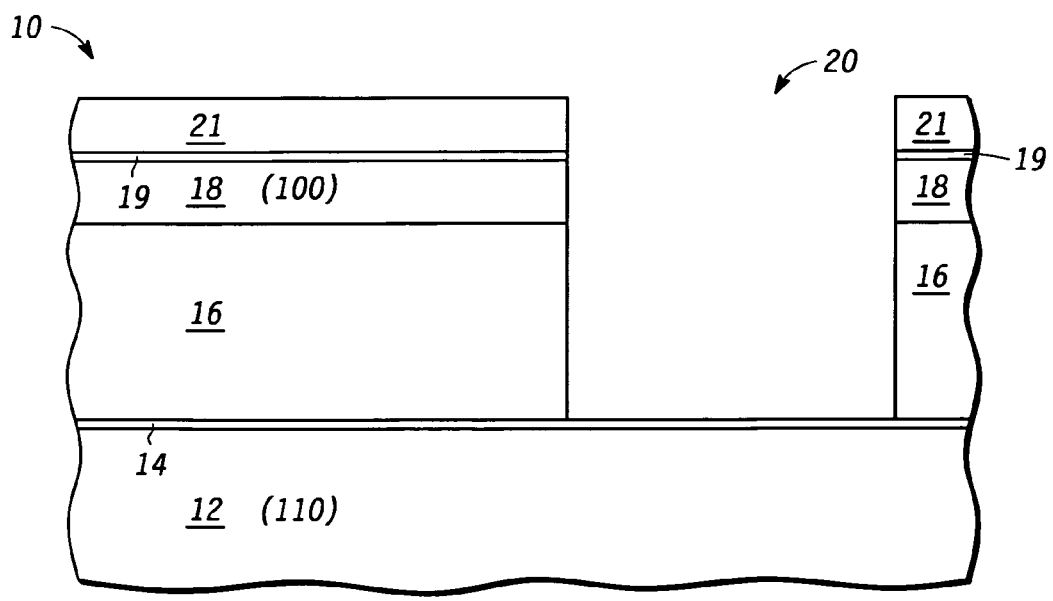

Turning now to FIG. 2, an opening 20 is formed in a desired region of (i) trench isolation and (ii) first crystal orientation epitaxial growth, wherein the opening 20 extends through a series of layers, down to the buried etch stop layer 14. Formation of opening 20 can be accomplished using any suitable patterning and etch techniques, wherein the etch chemistry/chemistries are suitable to etch through the ARC/polish stop layer 21, the pad oxide layer 19, the SOI layer 18, and the BOX 16. In one embodiment, the etch chemistry (chemistries) used to form opening 20 is (are) selected to provide an aggressive etch that is highly selective to the etch stop layer 14. For example, formation of opening 20 can be accomplished using a dry etch. In addition, the opening 20 has sidewalls with a fairly vertical profile and a bottom surface defined by an exposed portion of the etch stop layer 14.

Figure 3:
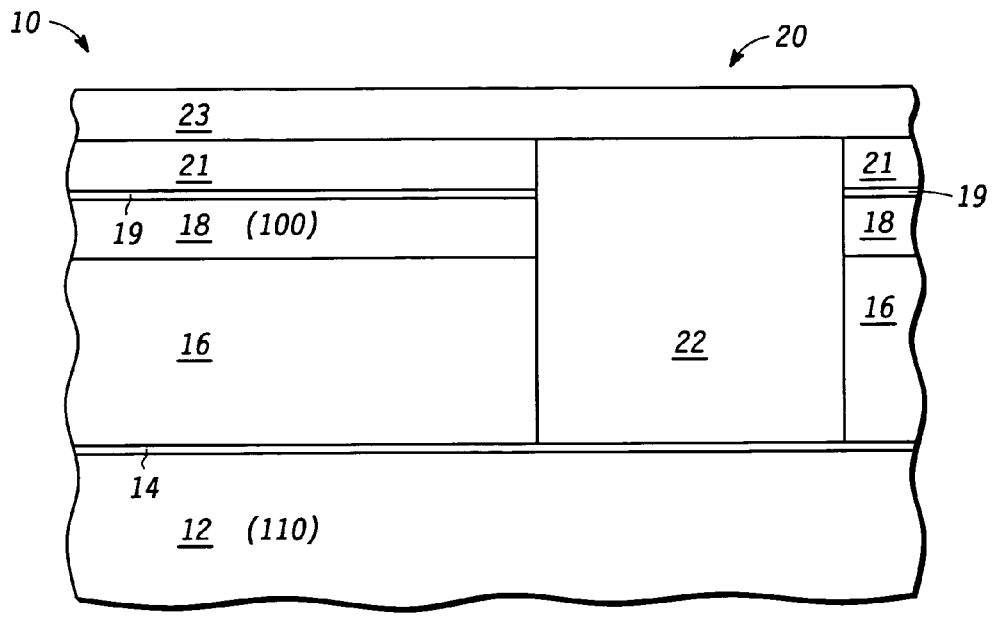

Turning now to FIG. 3, opening 20 is filled with an oxide 22, preferably, a deposited oxide. In one embodiment, the deposited oxide 22 comprises a high density plasma enhanced chemical vapor deposition (HDPECVD) oxide. In another embodiment, the deposited oxide 22 comprises a plasma enhanced chemical vapor deposition (PECVD) oxide. In yet another embodiment, the deposited oxide 22 comprises a chemical vapor deposition (CVD) oxide.

Subsequent to the filling of opening 20 with the deposited oxide 22, the entire structure is planarized down to the ARC/polish stop layer 21, using any suitable planarization technique. For example, the structure 10 could be planarized using chemical mechanical polishing. A second anti-reflective coating (ARC) layer 23 is then deposited onto the planarized surfaces of the ARC/polish stop layer 21 and the deposited oxide 22.

Figure 4:
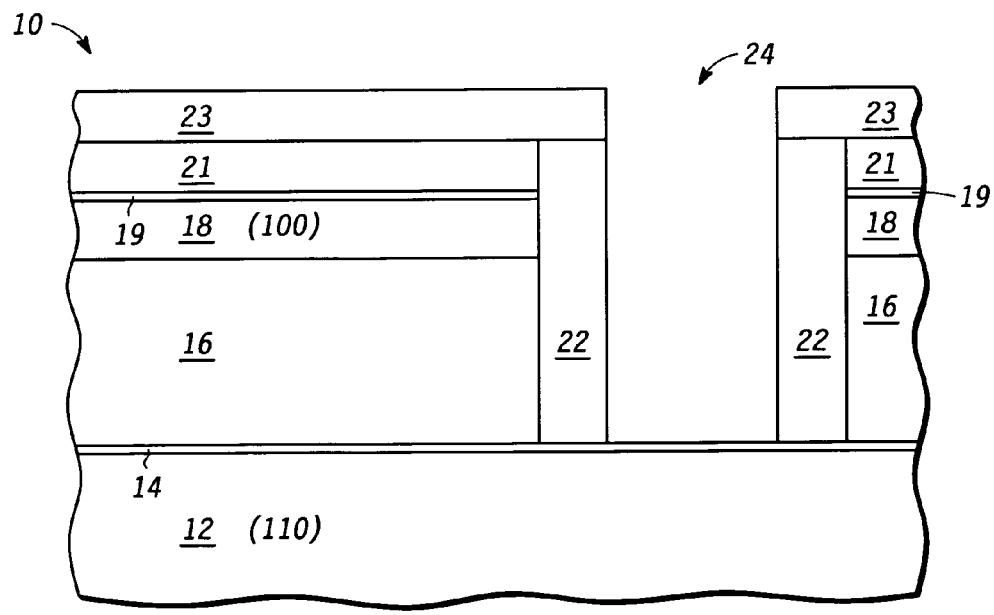

Turning now to FIG. 4, an opening 24 is formed within a desired region of the first crystal orientation epitaxial growth, wherein the opening extends through the ARC 23 and the deposited oxide 22, down to the buried etch stop layer 14. Formation of the opening 24 can be accomplished using any suitable patterning and etch techniques, wherein the etch chemistry/chemistries are suitable to etch through the ARC layer 23 and the deposited oxide 22. The etch chemistry (chemistries) used to form opening 24 is (are) selected to provide an aggressive etch that is highly selective to the etch stop layer 14. In one embodiment, formation of opening 24 is accomplished using a dry etch. In addition, the opening 24 has sidewalls with a fairly vertical profile and a bottom surface defined by an exposed portion of the etch stop layer 14.

Figure 5:
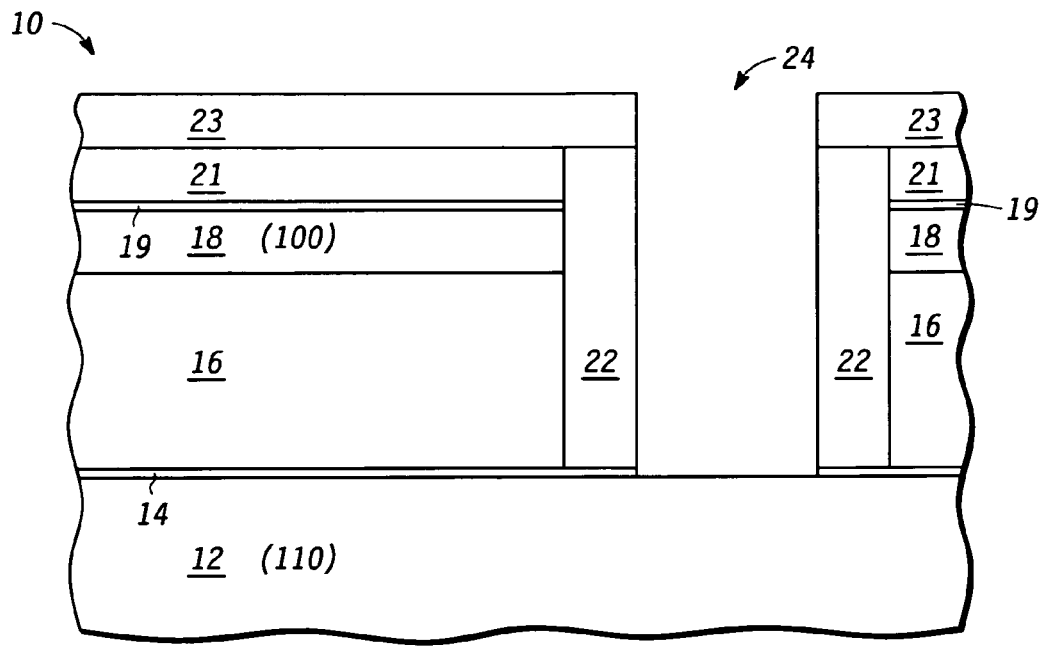

Subsequent to the formation of opening 24, a portion of the etch stop layer 14 exposed by the opening 24 as shown in FIG. 4 is then removed as illustrated in FIG. 5, thus forming opening 26. Removal of the exposed portion of etch stop layer 14 comprises the use of any suitable gentle etch that is highly selective to the deposited oxide 22 and highly selective to the underlying SOI substrate 12. The etch chemistry (chemistries) are selected so that the portion of surface of the SOI substrate 12 exposed by removal of the exposed portion of the etch stop layer 14 is a substantially defect-free surface. In other words, removal of the exposed portion of the etch stop layer 14 is carried out using an etch that minimizes or eliminates the risk of damaging the surface of the SOI substrate 12. In one embodiment, removal of the exposed portion of the etch stop layer 14 is accomplished using a wet etch.

Accordingly, FIG. 5 illustrates an opening 26 that is formed subsequent to removal of the exposed portion of etch stop layer 14. As understood, the introduction of the etch stop layer 14, in the region of the trench isolation formation and first crystal orientation epitaxial growth, eliminates the risk of damaging the exposed semiconductor surface. In contrast, prior techniques resulted in damaging the exposed semiconductor surface that occurs through use of a dry etch for forming an opening through the BOX layer without the presence of an intermediate etch stop layer between the BOX and the underlying substrate.

Figure 6:
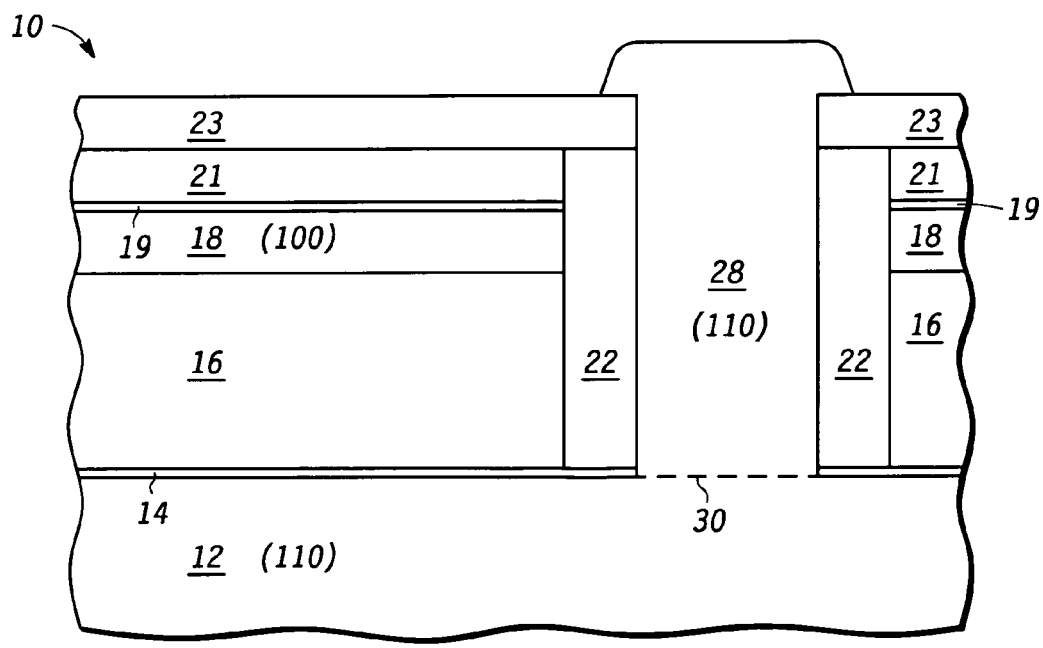

Referring now to FIG. 6, an epitaxial material 28 is grown on the exposed surface of the semiconductor substrate 12 within opening 26 (FIG. 5). Epitaxial material 28 is grown to a desired amount. For example, epitaxial material 28 can be grown to overflow the opening 26, wherein a portion of the epitaxial material overflows the opening 26 in the shape of a mushroom. As a result of the defect free surface at an interface 30 between the underlying substrate 12 and the epitaxial material 28, the epitaxial material 28 will be of high quality and have minimal defects. The interface 30 is illustrated as a dashed line in FIG. 6 and in reality may not be readily discernable in the actual device structure. The epitaxial material 28 will also comprise a same crystal orientation as that of the SOI substrate 12. In one embodiment, the SOI substrate 12 comprises a silicon substrate having a (110) crystal orientation and the epitaxial material 28 comprises silicon having a (110) crystal orientation.

Figure 7:
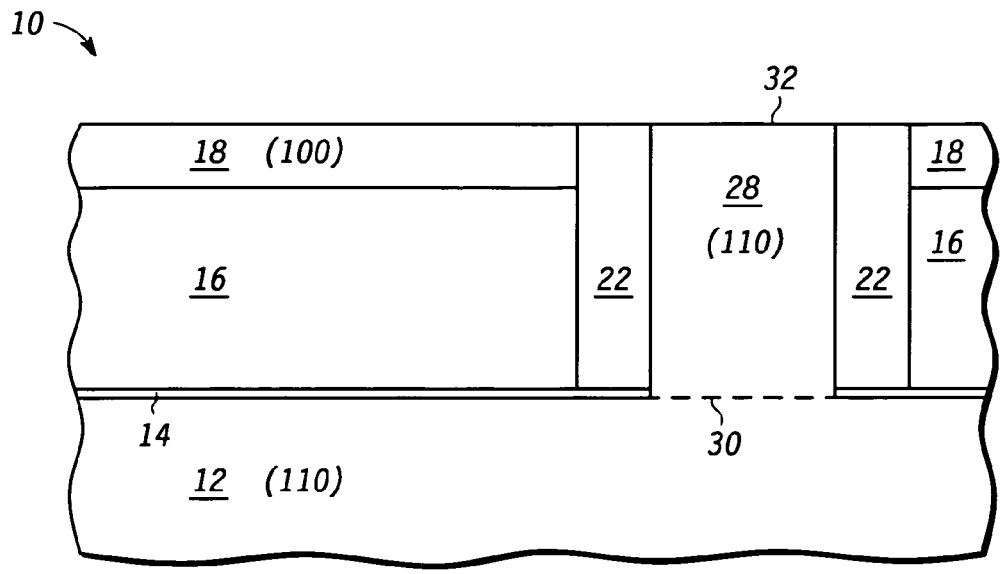

Subsequent to the epitaxial growth of material 28, the structure is planarized as shown in FIG. 7. The entire structure is planarized, to remove a portion of epi 28 and to remove ARC layer 23, ARC/polish stop layer 21, and pad oxide layer 19, down to the SOI layer 18, using any suitable planarization technique. For example, the structure 10 could be planarized using chemical mechanical polishing. The planarized surface is indicated by reference numeral 32 in FIG. 7.

Figure 8:
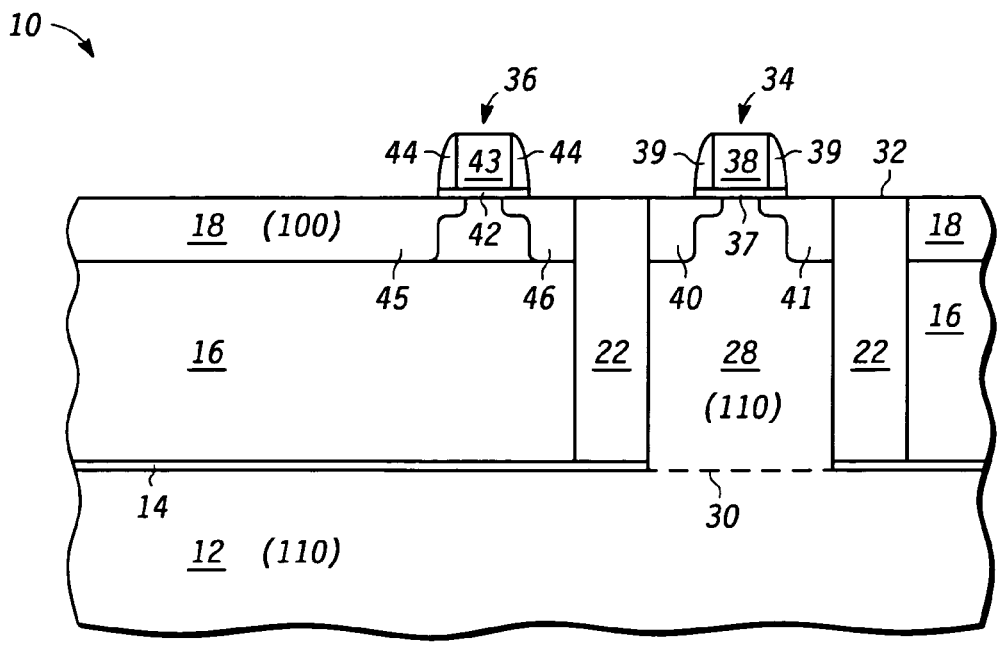

Referring now to FIG. 8, semiconductor devices 34 and 36 are formed using any suitable semiconductor processing techniques. Semiconductor devices 34 and 36 are formed in first and second regions, wherein the first region corresponds to a region of the planarized epitaxial material 28 having the first crystal orientation and the second region corresponds to the SOI layer 18 having the second crystal orientation. Device 34 includes, for example, a gate dielectric 37, gate electrode 38, sidewall spacers 39, and source/drain regions 40 and 41. Similarly, device 36 includes, for example, a gate dielectric 42, gate electrode 43, sidewall spacers 44, and source/drain regions 45 and 46.

Semiconductor devices 34 and 36 can comprise any suitable semiconductor devices according to the requirements of a given semiconductor device application and a corresponding manufacturing process. In one embodiment, semiconductor device 34 comprises a P-type device and semiconductor device 36 comprises an N-type device. In addition, the remainder portions of deposited oxide 22 form suitable isolation regions, for example, between device 34, device 36 and possibly other devices (not shown).

Figure 9:
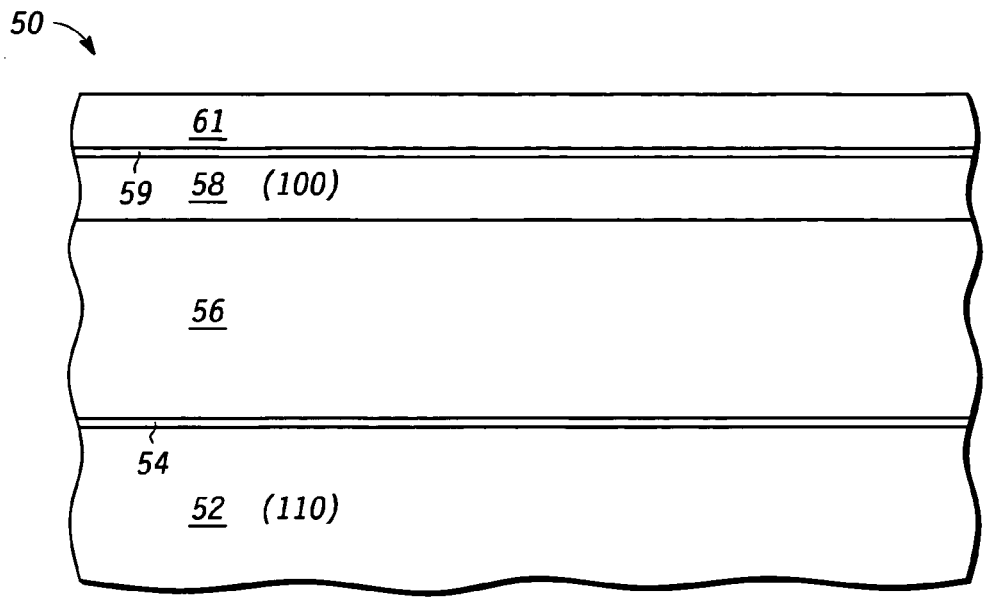
FIGS. 9-17 illustrate device cross-sections at various process steps in the method of making a semiconductor device structure having multiple crystal orientations according to another embodiment of the present disclosure.

FIGS. 9-17 illustrate device cross-sections at various process steps in the method of making a semiconductor device structure having multiple crystal orientations according to another embodiment of the present disclosure. Turning now to FIG. 9, a portion of a semiconductor device 50 includes a semiconductor-on-insulator (SOI) substrate 52 having an etch stop layer 54 disposed between a buried oxide (BOX) layer 56 and substrate 52 of the SOI structure. In one embodiment, the etch stop layer 54 comprises an etch stop layer added to the SOI structure as part of a layer transfer or wafer bonding process during the manufacture of the SOI wafer. SOI structure comprises any suitable semiconductor-on-insulator structure according to the particular requirements of a given semiconductor device application. For example, the SOI structure could include a silicon on insulator structure, a germanium on insulator structure, or other suitable strained or non-strained semiconductor on insulator structure.

Etch stop layer 54 comprises a layer selected in conjunction with an available highly selective etch chemistry or chemistries, with respect to the BOX layer 56 and with respect to the underlying SOI substrate 52. In particular, layer 54 acts as an etch stop for a subsequent oxide etch with respect to BOX layer 56. The etch stop layer 54 comprises, for example, a nitride, hafnium oxide, or any other suitable dielectric or insulator. Furthermore, in another embodiment, the etch stop layer 54 comprises any suitable dielectric layer stack. One example of a dielectric layer stack includes an oxide and a nitride, wherein the oxide is overlying the underlying SOI substrate and the nitride is on top of the oxide. Furthermore, the etch stop layer 54 can comprise a dielectric layer stack of a high-K dielectric layer with an oxide interface layer.

In addition, an SOI layer 58 is disposed overlying the BOX 56. In one embodiment, the substrate 52 includes a first crystal orientation and the SOI layer 58 includes a second crystal orientation. Substrate 52 can comprise any suitable semiconductor substrate for a given semiconductor device application. In one embodiment, substrate 52 comprises silicon. In addition, SOI layer 58 comprises any suitable semiconductor layer for a given semiconductor device application. In one embodiment, SOI layer 58 comprises silicon.

As illustrated, substrate 52 comprises a semiconductor substrate having a (110) crystal orientation and SOI layer 58 comprises a semiconductor layer having a (100) crystal orientation. Other combinations of crystal orientations are possible, for example, substrate 52 can comprise a semiconductor substrate having a (100) crystal orientation and SOI layer 58 can comprise a semiconductor layer having a (110) crystal orientation.

Further with reference to FIG. 9, a suitable pad oxide 59 and a first anti-reflective coating (ARC)/polish stop layer 61 are disposed overlying the SOI layer 58, as discussed further herein. Pad oxide 59 provides a buffer between the ARC/polish stop layer 61 and the SOI layer 58. In one embodiment, pad oxide 59 comprises a thermal oxide and the ARC/polish stop layer 61 comprises a nitride.

Figure 10:
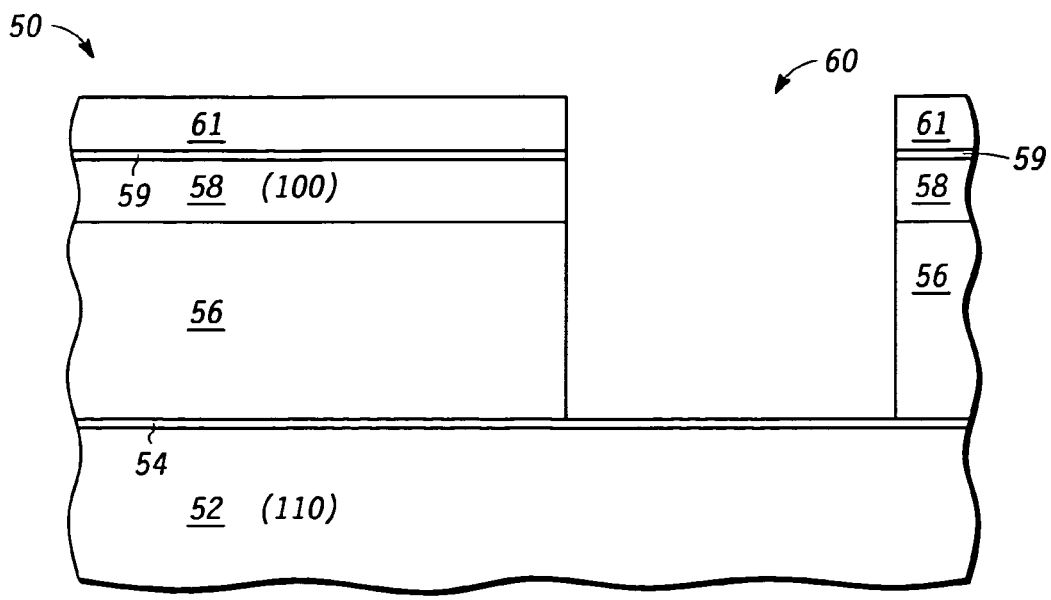

Turning now to FIG. 10, an opening 60 is formed in a desired region of (i) trench isolation and (ii) first crystal orientation epitaxial growth, wherein the opening 60 extends through a series of layers, down to the buried etch stop layer 54. Formation of opening 60 can be accomplished using any suitable patterning and etch techniques, wherein the etch chemistry/chemistries are suitable to etch through the ARC/polish stop layer 61, the pad oxide layer 59, the SOI layer 58, and the BOX 56. In one embodiment, the etch chemistry (chemistries) used to form opening 60 is (are) selected to provide an aggressive etch that is highly selective to the etch stop layer 54. For example, formation of opening 60 can be accomplished using a dry etch. In addition, the opening 60 has sidewalls with a fairly vertical profile and a bottom surface defined by an exposed portion of the etch stop layer 54.

Figure 11:
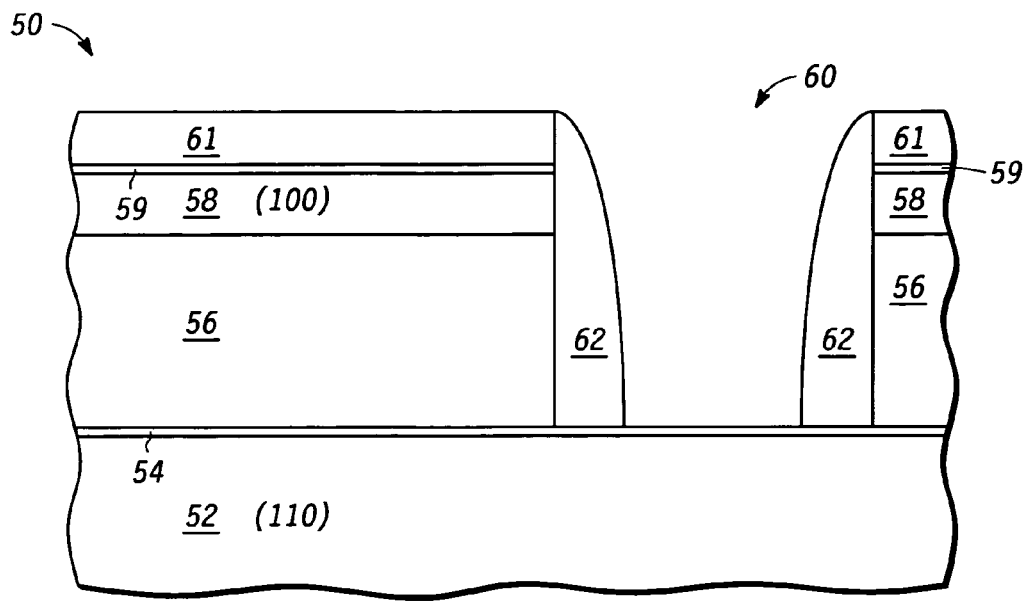

Turning now to FIG. 11, the method includes forming sidewall spacers 62. Sidewall spacers 62 can be formed by depositing a dielectric and etching the dielectic back to form the sidewall spacers, for example, using a suitable sidewall spacer formation technique. The dielectric includes, for example, an oxide, a nitride, or any other suitable dielectric. In one embodiment, the dielectric of sidewall spacer 62 comprises a high density plasma enhanced chemical vapor deposition (HDPECVD) oxide. In another embodiment, the dielectric of sidewall spacer 62 comprises a plasma enhanced chemical vapor deposition (PECVD) oxide. In yet another embodiment, the dielectric of sidewall spacer 62 comprises a chemical vapor deposition (CVD) oxide. Subsequent to formation of sidewall spacers 62, a portion of the etch stop layer 54 remains exposed within opening 60.

Figure 12:
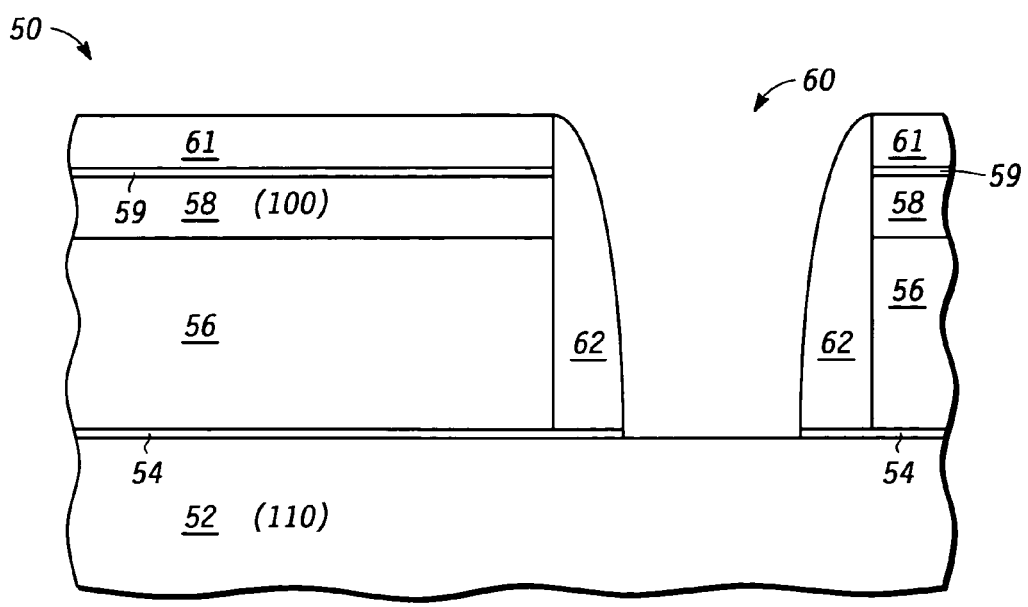

Subsequent to the formation of sidewall spacers 62, a portion of the etch stop layer 54 exposed by the opening 60 as shown in FIG. 11 is then removed as illustrated in FIG. 12, thus forming opening 64. Removal of the exposes portion of etch stop layer 54 comprises the use of any suitable gentle etch that is highly selective to the sidewall spacers 62 and highly selective to the underlying SOI substrate 52. The etch chemistry (chemistries) are selected so that the portion of surface of the SOI substrate 52 exposed by removal of the exposed portion of the etch stop layer 54 is a substantially defect-free surface. In other words, removal of the exposed portion of the etch stop layer 54 is carried out using an etch that minimizes or eliminates the risk of damaging the surface of the SOI substrate 52. In one embodiment, removal of the exposed portion of the etch stop layer 54 is accomplished using a wet etch.

Accordingly, FIG. 12 illustrates an opening 64 that is formed subsequent to removal of the exposed portion of etch stop layer 54. As understood, the introduction of the etch stop layer 54, in the region of the trench isolation formation and first crystal orientation epitaxial growth, eliminates the risk of damaging the exposed semiconductor surface. In contrast, prior techniques resulted in damaging the exposed semiconductor surface which occurs through use of a dry etch for forming an opening through the BOX layer without the presence of an intermediate etch stop layer between the BOX and the underlying substrate.

Figure 13:
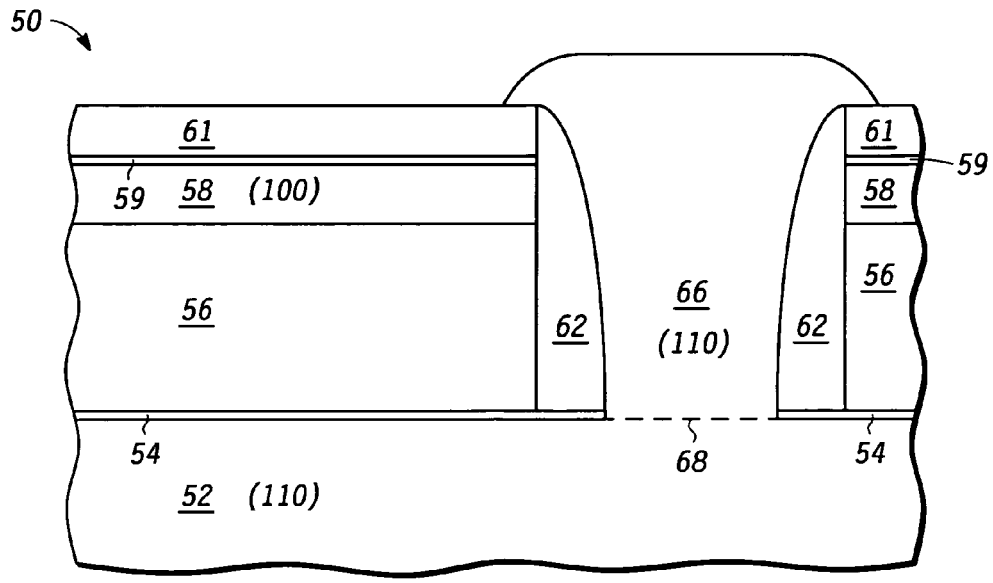

Referring now to FIG. 13, an epitaxial material 66 is grown on the exposed surface of the semiconductor substrate 52 within opening 64 (FIG. 12). Epitaxial material 66 is grown to a desired amount. For example, epitaxial material 66 can be grown to overflow the opening 64, wherein a portion of the epitaxial material overflows the opening 64 in the shape of a mushroom. As a result of the defect free surface at an interface 68 between the underlying substrate 52 and the epitaxial material 66, the epitaxial material 66 will be of high quality and have minimal defects. The interface 68 is illustrated as a dashed line in FIG. 13 and in reality may not be readily discernable in the actual device structure. The epitaxial material 66 will also comprise a same crystal orientation as that of the SOI substrate 52. In one embodiment, the SOI substrate 52 comprises a silicon substrate having a (110) crystal orientation and the epitaxial material 66 comprises silicon having a (110) crystal orientation.

Figure 14:
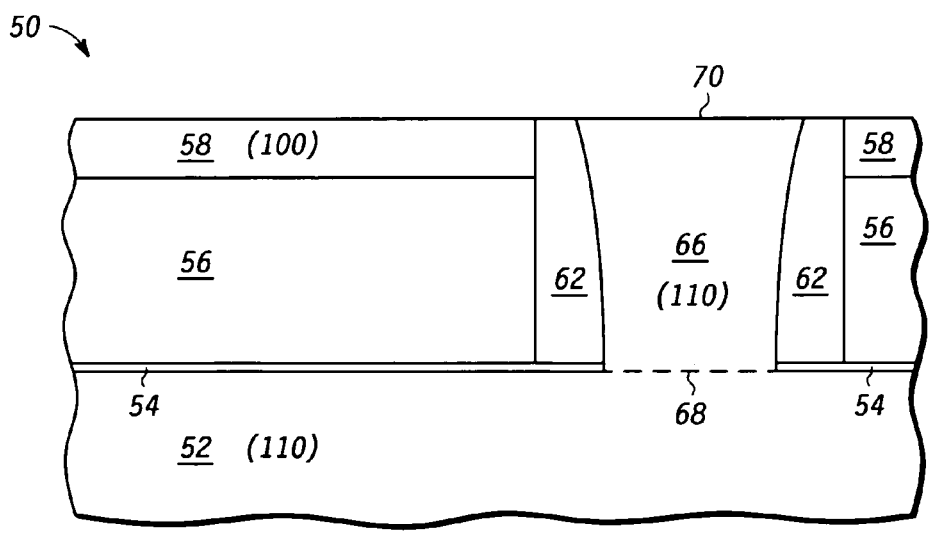

Subsequent to the epitaxial growth of material 66, the structure is planarized as shown in FIG. 14. The entire structure is planarized, to remove a portion of epi 66 and to remove ARC/polish stop layer 61 and pad oxide layer 59, down to the SOI layer 58, using any suitable planarization technique. For example, the structure 50 could be planarized using chemical mechanical polishing. The planarized surface is indicated by reference numeral 70 in FIG. 14.

Figure 15:
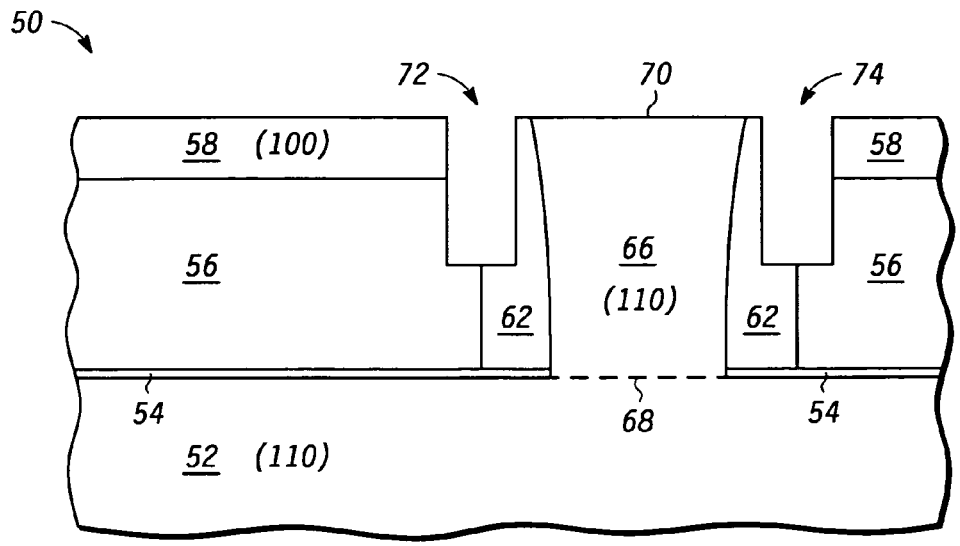

Referring now to FIG. 15, shallow trench isolation (STI) openings 72 and 74 are formed. The STI openings 72 and 74 are formed across a boundary between the SOI layer 58 (and BOX 56) and sidewall spacer 62. With respect to providing isolation between a subsequently formed P-type and an N-type device, the sidewall spacers 62 alone may provide sufficient isolation. However, STI regions are required between similar type devices.

Figure 16:
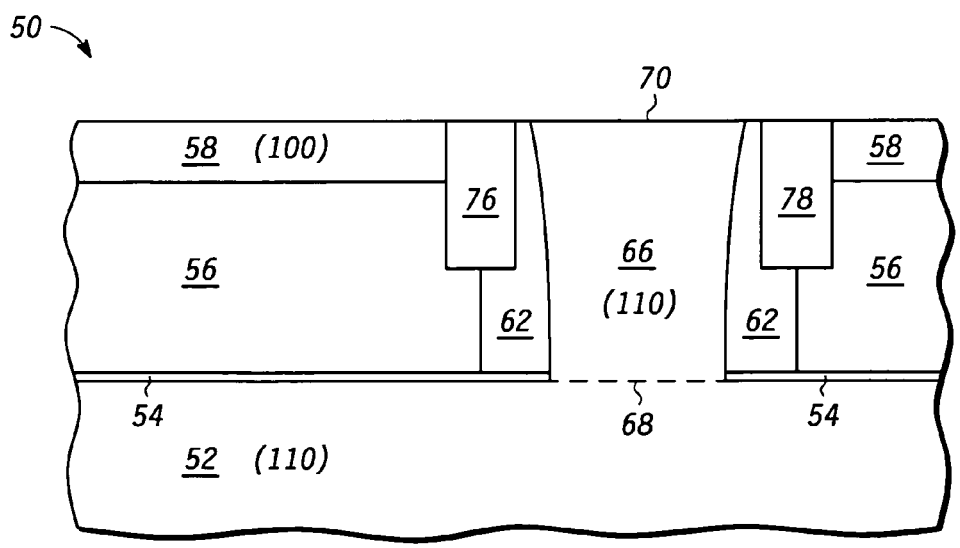

Turning now to FIG. 16, the STI openings 72 and 74 are filled with suitable shallow trench isolation (STI) material, indicated by reference numerals 76 and 78, respectively. The STI material may comprise, for example, a deposited oxide, a deposited nitride, or any other suitable STI material. Subsequent to filling the STI openings, the entire structure is again planarized using any suitable planarization technique. The planarized surface is indicated by reference numeral 70 in FIG. 16.

Figure 17:
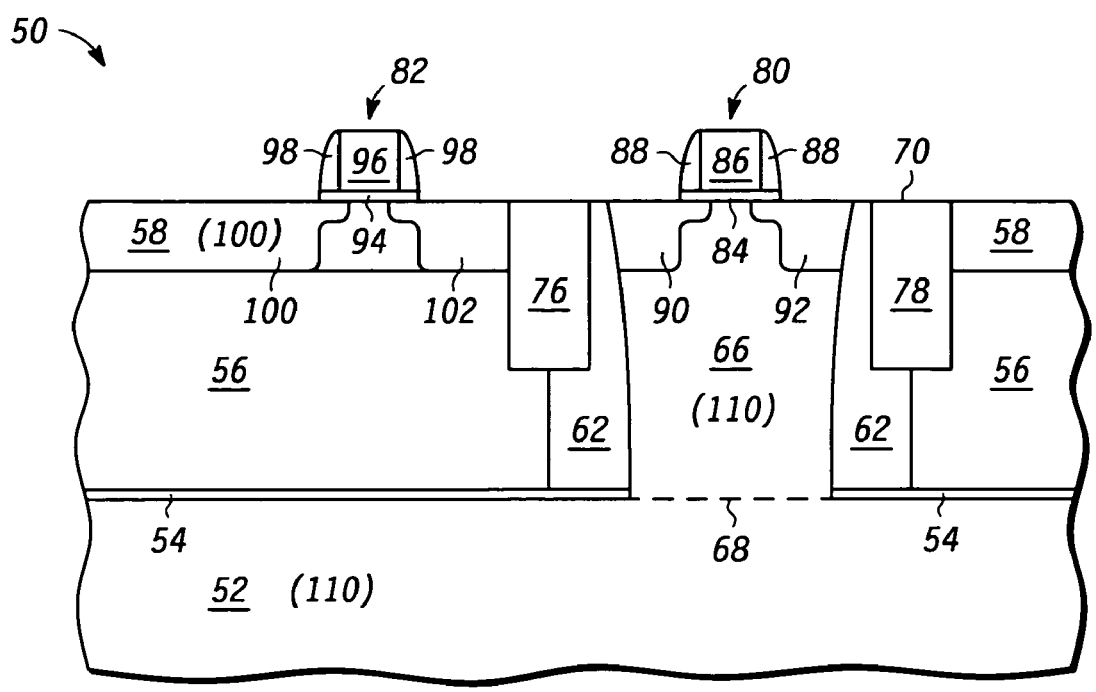

Referring now to FIG. 17, semiconductor devices 80 and 82 are formed using any suitable semiconductor processing techniques. Semiconductor devices 80 and 82 are formed in first and second regions, wherein the first region corresponds to a region of the planarized epitaxial material 66 having the first crystal orientation and the second region corresponds to the SOI layer 58 having the second crystal orientation. Device 80 includes, for example, a gate dielectric 84, gate electrode 86, sidewall spacers 88, and source/drain regions 90 and 92. Similarly, device 82 includes, for example, a gate dielectric 94, gate electrode 96, sidewall spacers 98, and source/drain regions 100 and 102.

Semiconductor devices 80 and 82 can comprise any suitable semiconductor devices according to the requirements of a given semiconductor device application and a corresponding manufacturing process. In one embodiment, semiconductor device 80 comprises a P-type device and semiconductor device 82 comprises an N-type device. In addition, the remainder portions of sidewall spacers 62 and the STI regions 76 and 78 form suitable isolation regions, for example, between device 80, device 82 and possibly other devices (not shown).

According to one embodiment, a method of making a semiconductor device structure comprises providing a semiconductor substrate, the semiconductor substrate including a first semiconductor layer having a first surface (or crystal) orientation, a first dielectric layer over the first semiconductor layer, a second dielectric layer over the first dielectric layer, and a second semiconductor layer over the second dielectric layer, wherein the second semiconductor layer has a second surface (or crystal) orientation. The method further comprises performing a patterned etch through the second semiconductor layer and the second dielectric layer to form an opening in the second semiconductor layer and the second dielectric layer, wherein the patterned etch is stopped on the first dielectric layer and the patterned etch comprises a first etch type. The method further includes etching through the first dielectric layer to the first semiconductor layer using a second etch type whereby the first semiconductor layer has an exposed portion at the opening, epitaxially growing a semiconductor region of the first surface (or crystal) orientation from the exposed portion into the opening, forming a transistor of the first type in the semiconductor region, and forming a transistor of the second type in the second semiconductor layer.

In one embodiment, the first dielectric layer has a first thickness, the second dielectric layer has a second thickness, and the second thickness is at least five times greater than the first thickness. In another embodiment, the first dielectric layer comprises a high-K dielectric. In another embodiment, the second etch type comprises a hot gas that contains chlorine, wherein the second etch type is further characterized as being hydrochloric acid, and wherein the second etch type is further characterized as applying the hot gas at a temperature of at least 500 degrees Celsius. In yet another embodiment, the second etch type etches the first dielectric layer at a significantly greater rate than the first semiconductor layer, the second dielectric layer, and the second semiconductor layer.

In yet another embodiment, the method further comprises, prior to the step of etching through the first dielectric layer, the following steps: filling the opening with an insulating material; and pattern etching through the insulating material to leave a portion of the insulating material along a perimeter of the opening for providing isolation between the first transistor and the second transistor.

In yet still another embodiment, the method further comprises forming an antireflective coating over the insulating material prior to pattern etching through the insulating material. In still another embodiment, the method further comprises forming a sidewall spacer along a perimeter of the opening prior to the step of etching through the first dielectric layer, removing at least a first portion of the sidewall spacer, and forming an isolation region where the first portion of the sidewall spacer was removed.

In one embodiment, the first surface orientation comprises (110), the second surface orientation comprises (100), the first type of transistor comprises P channel, the second type of transistor comprises N channel, and the first semiconductor region is of a different material composition from the first semiconductor layer.

According to a still further embodiment, a method of forming a semiconductor device structure, comprises providing a semiconductor substrate, wherein the semiconductor substrate includes: a first semiconductor layer having a first crystal orientation; a first dielectric layer over the first semiconductor layer; a second dielectric layer over the first dielectric layer; and a second semiconductor layer over the second dielectric layer, wherein the second semiconductor layer has a second crystal orientation. The method further comprises etching through the second semiconductor layer and the second dielectric layer whereby the first dielectric layer has an exposed portion, etching through the first dielectric layer whereby the first semiconductor layer has an exposed portion, and epitaxially growing a semiconductor region from the exposed portion of the first semiconductor layer.

In one embodiment, the etching through the second dielectric layer comprises applying a fluorine-containing gas, and the step of etching through the first dielectric layer comprises applying a chlorine-containing gas at temperature of at least 500 degrees Celsius.

In another embodiment, the method further comprises forming a first transistor in the semiconductor region and forming a second transistor in the second semiconductor layer, wherein the second transistor is as different type from the first transistor. In yet another embodiment, the first dielectric layer comprises a high K dielectric layer that is at least five times thicker than the second dielectric layer. The first crystal orientation is a surface orientation of (110) and the second crystal orientation is a surface of orientation of (100).

In another embodiment, the method further comprises, after etching through the second dielectric layer and prior to etching through the first dielectric layer, the following steps: depositing an insulating material, and pattern etching through the insulating material to the first dielectric layer to leave an opening through the insulating material for the exposed portion of the first insulating layer. In a still further embodiment, wherein the step of etching through the second semiconductor layer and the second dielectric layer leaves an opening, the method further comprises: forming a sidewall spacer along a perimeter of the opening prior to the step of etching through the first dielectric layer, removing at least a first portion of the sidewall spacer, and forming an isolation region where the first portion of the sidewall spacer was removed.

According to another embodiment, a semiconductor device structure comprises a first semiconductor layer having a first crystal orientation, a semiconductor region extending vertically from the first semiconductor layer, the semiconductor region having the first crystal orientation, and a second semiconductor layer over and parallel to the first semiconductor layer, wherein the second semiconductor layer has a different crystal orientation from the first crystal orientation. The semiconductor device structure also includes a first insulating layer over the first semiconductor layer and around the semiconductor region, wherein the first insulating layer has different etch characteristics from the first semiconductor layer and a second insulating layer over the first insulating layer, under the second semiconductor layer, and around the semiconductor region, wherein the second insulating layer has different etch characteristics from the first insulating layer. The semiconductor device structure further includes a transistor of a first type on the semiconductor region and a transistor of a second type on the second semiconductor layer. According to another embodiment, the semiconductor device further comprises an isolation region between the semiconductor region and the second semiconductor layer, wherein the semiconductor region and the second semiconductor layer have top surfaces that are substantially coplanar and the second insulating layer is at least five times thicker than the first insulating layer.

In the foregoing specification, the disclosure has been described with reference to the various embodiments. However, one of ordinary skill in the art appreciates that various modifications and changes can be made without departing from the scope of the present embodiments as set forth in the claims below. Accordingly, the specification and figures are to be regarded in an illustrative rather than a restrictive sense, and all such modifications are intended to be included within the scope of the present embodiments. For example, the embodiments of the present disclosure enable the fabrication of high quality substrates with dual orientation (DSO) by inserting a dielectric layer between the BOX and the substrate, as discussed herein. The high quality DSO substrates are further formed by a defect-free epi process on define active areas, allowing for high quality enhanced electron and hole mobility in (100) and (110), respectively. Furthermore, a semiconductor device having dual or multiple crystal orientations can include one or more of a transistor, a diode, an optical device, a light emitting diode, or a laser. An integrated circuit can also be formed using one or more of the methods according to the embodiments herein. Still further, while first and second crystallographic orientations have been described herein as being different from one another, in another embodiment, the first and second crystallographic orientations could be the same and do not have to differ.

Benefits, other advantages, and solutions to problems have been described herein above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the term "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method of making a semiconductor device structure, comprising:
   providing a semiconductor substrate comprising:
      a first semiconductor layer having a first surface orientation;
      a first dielectric layer over the first semiconductor layer, wherein the first dielectric layer comprises a high K dielectric;
      a second dielectric layer over the first dielectric layer; and
      a second semiconductor layer over the second dielectric layer, wherein the second semiconductor layer has a second surface orientation;
   performing a patterned etch through the second semiconductor layer and the second dielectric layer to form an opening in the second semiconductor layer and the second dielectric layer, wherein:
      the patterned etch is stopped on the first dielectric layer; and
      the patterned etch comprises a first etch type;
   etching through the first dielectric layer to the first semiconductor layer using a second etch type whereby the first semiconductor layer has an exposed portion at the opening;
   epitaxially growing a semiconductor region of the first surface orientation from the exposed portion into the opening;
   forming a transistor of the first type in the semiconductor region;
   forming a transistor of the second type in the second semiconductor layer.

2. The method of claim 1, wherein:
   the first dielectric layer has a first thickness;
   the second dielectric layer has a second thickness; and
   the second thickness is at least five times greater than the first thickness.

3. The method of claim 1, wherein the second etch type comprises a hot gas that contains chlorine.

4. The method of claim 3, wherein the second etch type is further characterized as being hydrochloric acid.

5. The method of claim 4, wherein the second etch type is further characterized as applying the hot gas at a temperature of at least 500 degrees Celsius.

6. The method of claim 1, wherein the second etch type etches the first dielectric layer at a significantly greater rate than the first semiconductor layer, the second dielectric layer, and the second semiconductor layer.

7. The method of claim 1, further comprising, prior to the step of etching through the first dielectric layer, the following steps:
   filling the opening with an insulating material; and
   pattern etching through the insulating material to leave a portion of the insulating material along a perimeter of the opening for providing isolation between the first transistor and the second transistor.

8. The method of claim 1, further comprising forming an antireflective coating over the insulating material prior to pattern etching through the insulating material.

9. The method of claim 1, further comprising:
   forming a sidewall spacer along a perimeter of the opening prior to the step of etching through the first dielectric layer;
   removing at least a first portion of the sidewall spacer; and
   forming an isolation region where the first portion of the sidewall spacer was removed.

10. The method of claim 1, wherein the first surface orientation comprises (110), the second surface orientation comprises (100), the first type of transistor comprises P channel, the second type of transistor comprises N channel, and the first semiconductor region is of a different material composition from the first semiconductor layer.

11. A method of forming a semiconductor device structure, comprising:
   providing a semiconductor substrate comprising:
      a first semiconductor layer having a first crystal orientation;
      a first dielectric layer over the first semiconductor layer;
      a second dielectric layer over the first dielectric layer, wherein the first dielectric layer comprises a high K dielectric layer that is at least five times thicker than the second dielectric layer; and
      a second semiconductor layer over the second dielectric layer, wherein the second semiconductor layer has a second crystal orientation;
   etching through the second semiconductor layer and the second dielectric layer whereby the first dielectric layer has an exposed portion;
   etching through the first dielectric layer whereby the first semiconductor layer has an exposed portion; and
   epitaxially growing a semiconductor region from the exposed portion of the first semiconductor layer.

12. The method of claim 11, wherein:
   the etching through the second dielectric layer comprises applying a fluorine-containing gas; and
   the step of etching through the first dielectric layer comprises applying a chlorine-containing gas at temperature of at least 500 degrees Celsius.

13. The method of claim 11, further comprising
   forming a first transistor in the semiconductor region; and forming a second transistor in the second semiconductor layer, wherein the second transistor is a different type from the first transistor.

14. The method of claim 11, wherein the first crystal orientation is a surface orientation of (110) and the second crystal orientation is a surface of orientation of (100).

15. The method of claim 11, further comprising, after etching through the second dielectric layer and prior to etching through the first dielectric layer, the following steps:
   depositing an insulating material; and
   pattern etching through the insulating material to the first dielectric layer to leave an opening through the insulating material for the exposed portion of the first insulating layer.

16. A method of forming a semiconductor device structure, comprising:
   providing a semiconductor substrate comprising:
      a first semiconductor layer having a first crystal orientation;
      a first dielectric layer over the first semiconductor layer;
      a second dielectric layer over the first dielectric layer; and
      a second semiconductor layer over the second dielectric layer, wherein the second semiconductor layer has a second crystal orientation;
   etching through the second semiconductor layer and the second dielectric layer whereby the first dielectric layer has an exposed portion;
   etching through the first dielectric layer whereby the first semiconductor layer has an exposed portion; and
   epitaxially growing a semiconductor region from the exposed portion of the first semiconductor layer, wherein the step of etching through the second semiconductor layer and the second dielectric layer leaves an opening, further comprising:
      forming a sidewall spacer along a perimeter of the opening prior to the step of etching through the first dielectric layer;
      removing at least a first portion of the sidewall spacer; and
      forming an isolation region where the first portion of the sidewall spacer was removed.

* * * * *